(12) United States Patent
Hsu et al.

(10) Patent No.: US 8,802,497 B2
(45) Date of Patent: *Aug. 12, 2014

(54) FORMING SEMICONDUCTOR CHIP CONNECTIONS

(75) Inventors: Louis Lu-Chen Hsu, Fishkill, NY (US); Kangguo Cheng, Guilderland, NY (US); Timothy J. Dalton, Ridgefield, CT (US); Mukta G. Farooq, Hopewell Junction, NY (US); John A. Fitzsimmons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 9 days.

This patent is subject to a terminal disclaimer.

(21) Appl. No.: 13/432,963

(22) Filed: Mar. 28, 2012

(65) Prior Publication Data

US 2012/0187561 A1 Jul. 26, 2012

Related U.S. Application Data

(62) Division of application No. 12/471,656, filed on May 26, 2009, now Pat. No. 8,236,610.

(51) Int. Cl.
*H01L 21/00* (2006.01)
*H01L 25/065* (2006.01)

(52) U.S. Cl.
CPC ........ *H01L 25/0652* (2013.01); *H01L 25/0657* (2013.01)
USPC ............... 438/109; 438/107; 257/E21.511

(58) Field of Classification Search
CPC ............ H01L 25/0652; H01L 25/0655; H01L 25/0657

USPC ................. 257/686, 777, E23.02, E23.021, 257/E23.023, E23.145, E21.511, E23.013; 438/107, 109

See application file for complete search history.

(56) References Cited

U.S. PATENT DOCUMENTS

| | | | |
|---|---|---|---|
| 5,126,286 A | 6/1992 | Chance | |
| 5,276,963 A | 1/1994 | Flanders | |
| 5,606,198 A * | 2/1997 | Ono et al. | 257/666 |
| 5,611,050 A | 3/1997 | Theimer et al. | |
| 5,818,107 A | 10/1998 | Pierson et al. | |
| 5,857,858 A | 1/1999 | Gorowitz et al. | |
| 5,880,011 A | 3/1999 | Zablotny et al. | |
| 5,883,435 A * | 3/1999 | Geffken et al. | 257/758 |
| 6,034,438 A | 3/2000 | Petersen | |
| RE36,916 E | 10/2000 | Moshayedi | |
| 6,133,626 A | 10/2000 | Hawke et al. | |
| 6,236,115 B1 * | 5/2001 | Gaynes et al. | 257/774 |
| 6,545,355 B2 * | 4/2003 | Yanagida | 257/738 |

(Continued)

OTHER PUBLICATIONS

U.S. Appl. No. 12/471,656, Notice of Allowance and Fees Due dated Mar. 28, 2012.

(Continued)

*Primary Examiner* — Cheung Lee
*Assistant Examiner* — Jeremy Joy
(74) *Attorney, Agent, or Firm* — H. Dani Schnurmann; Hoffman Warnick LLC

(57) ABSTRACT

Systems and methods are disclosed that enable forming semiconductor chip connections. In one embodiment, the semiconductor chip includes a body having a polyhedron shape with a pair of opposing sides; and a solder member extending along a side that extends between the pair of opposing sides of the polyhedron shape.

2 Claims, 12 Drawing Sheets

(56) References Cited

U.S. PATENT DOCUMENTS

| | | | |
|---|---|---|---|
| 6,611,050 B1* | 8/2003 | Ference et al. | 257/679 |
| 6,705,925 B1 | 3/2004 | Cole et al. | |
| 6,734,538 B1 | 5/2004 | Sturcken | |
| 6,915,795 B2 | 7/2005 | Brouillette et al. | |
| 7,009,296 B1 | 3/2006 | Heo | |
| 7,019,397 B2* | 3/2006 | Ohuchi et al. | 257/734 |
| 7,129,114 B2 | 10/2006 | Akram | |
| 7,170,167 B2 | 1/2007 | Hsuan et al. | |
| 7,179,722 B2 | 2/2007 | Murata et al. | |
| 7,211,469 B2 | 5/2007 | Kwon | |
| 7,288,467 B2 | 10/2007 | Sekiya et al. | |
| 7,291,874 B2 | 11/2007 | Hsu | |
| 7,316,940 B2* | 1/2008 | Daubenspeck et al. | 438/114 |
| 7,317,251 B2 | 1/2008 | Meyer-Berg | |
| 8,236,610 B2* | 8/2012 | Hsu et al. | 438/113 |
| 2003/0042616 A1* | 3/2003 | Farrar | 257/777 |
| 2004/0080810 A1 | 4/2004 | Martin et al. | |
| 2006/0065976 A1* | 3/2006 | Hsuan et al. | 257/734 |
| 2007/0228544 A1 | 10/2007 | Jung et al. | |
| 2008/0023814 A1 | 1/2008 | Yang | |
| 2008/0224312 A1* | 9/2008 | Beyne | 257/738 |
| 2008/0315388 A1* | 12/2008 | Periaman et al. | 257/690 |

OTHER PUBLICATIONS

Joy, U.S. Appl. No. 12/471,656, Office Action Communication, Sep. 20, 2011, 12 pages.

Joy, U.S. Appl. No. 12/471,656, Final Office Action Communication, Oct. 28, 2011, 10 pages.

* cited by examiner

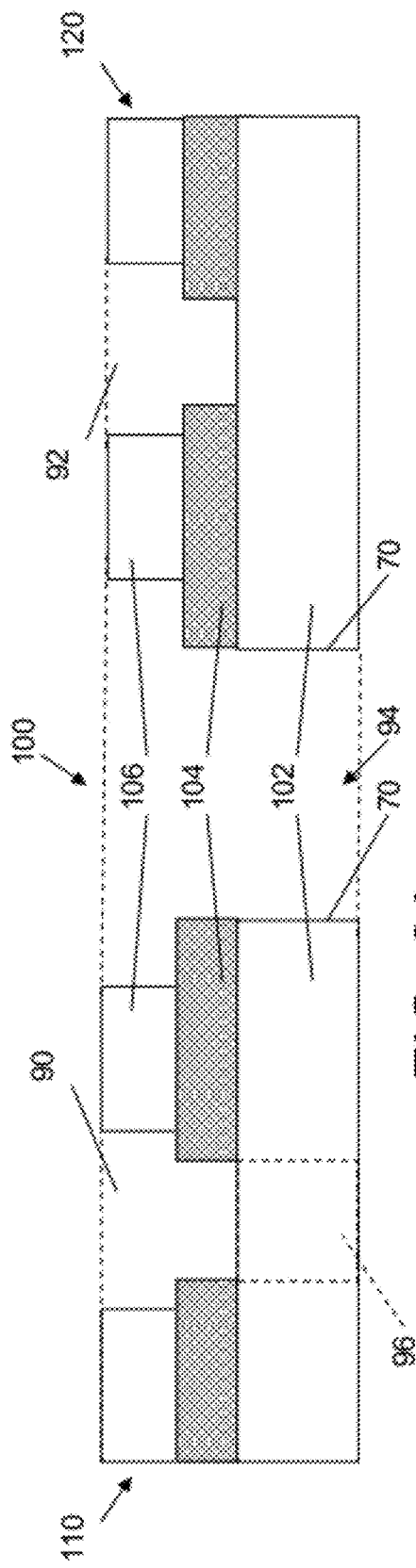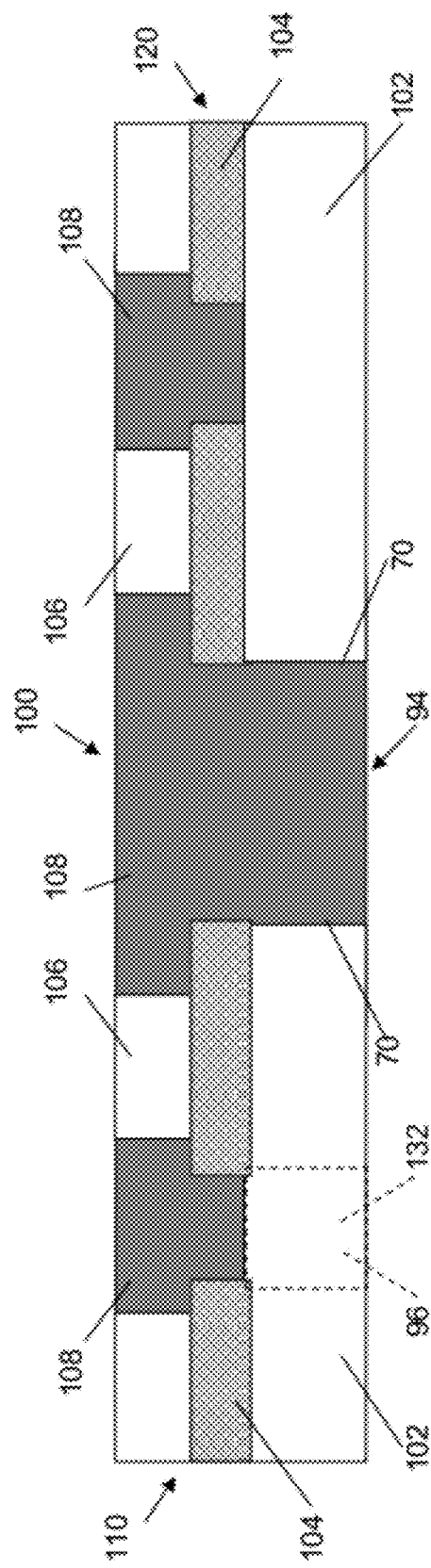

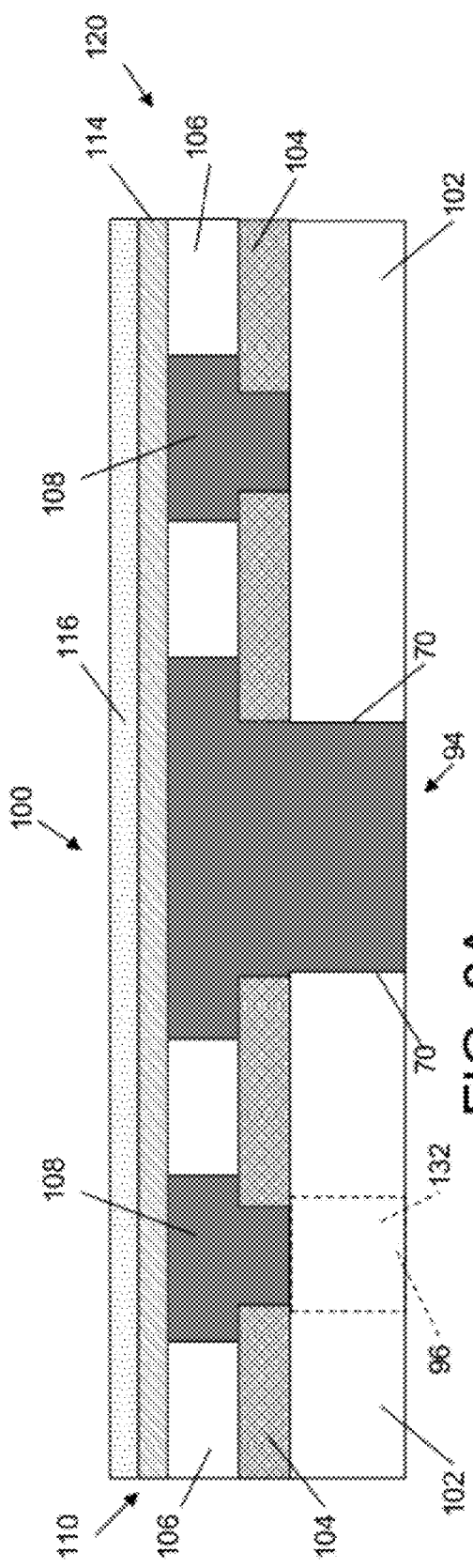
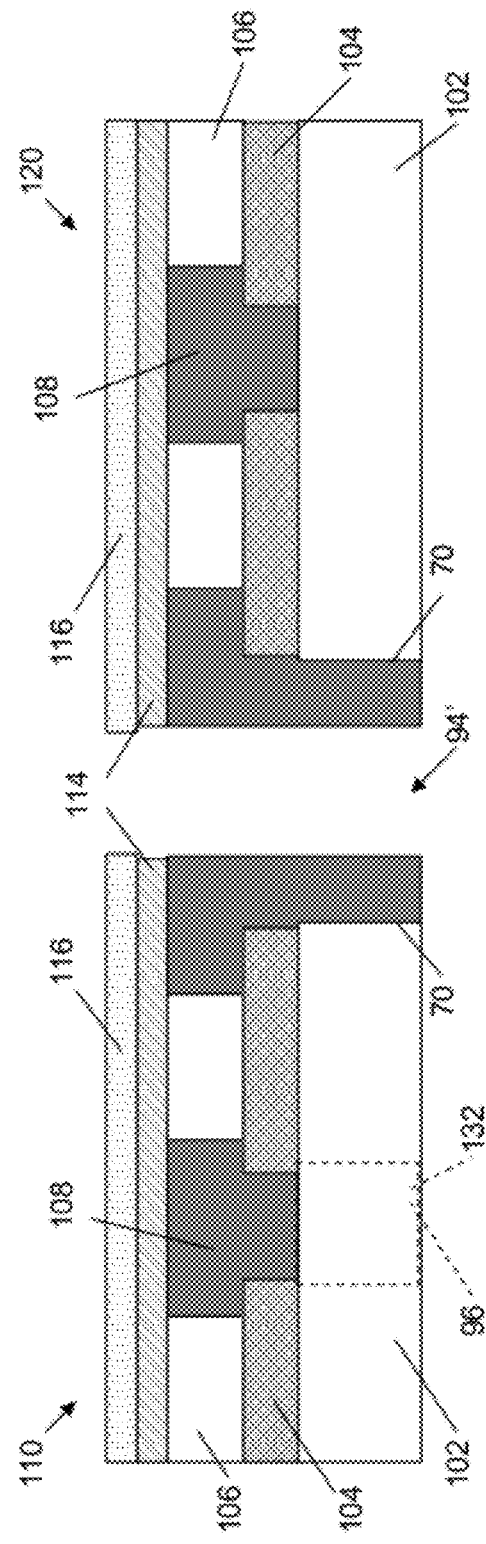

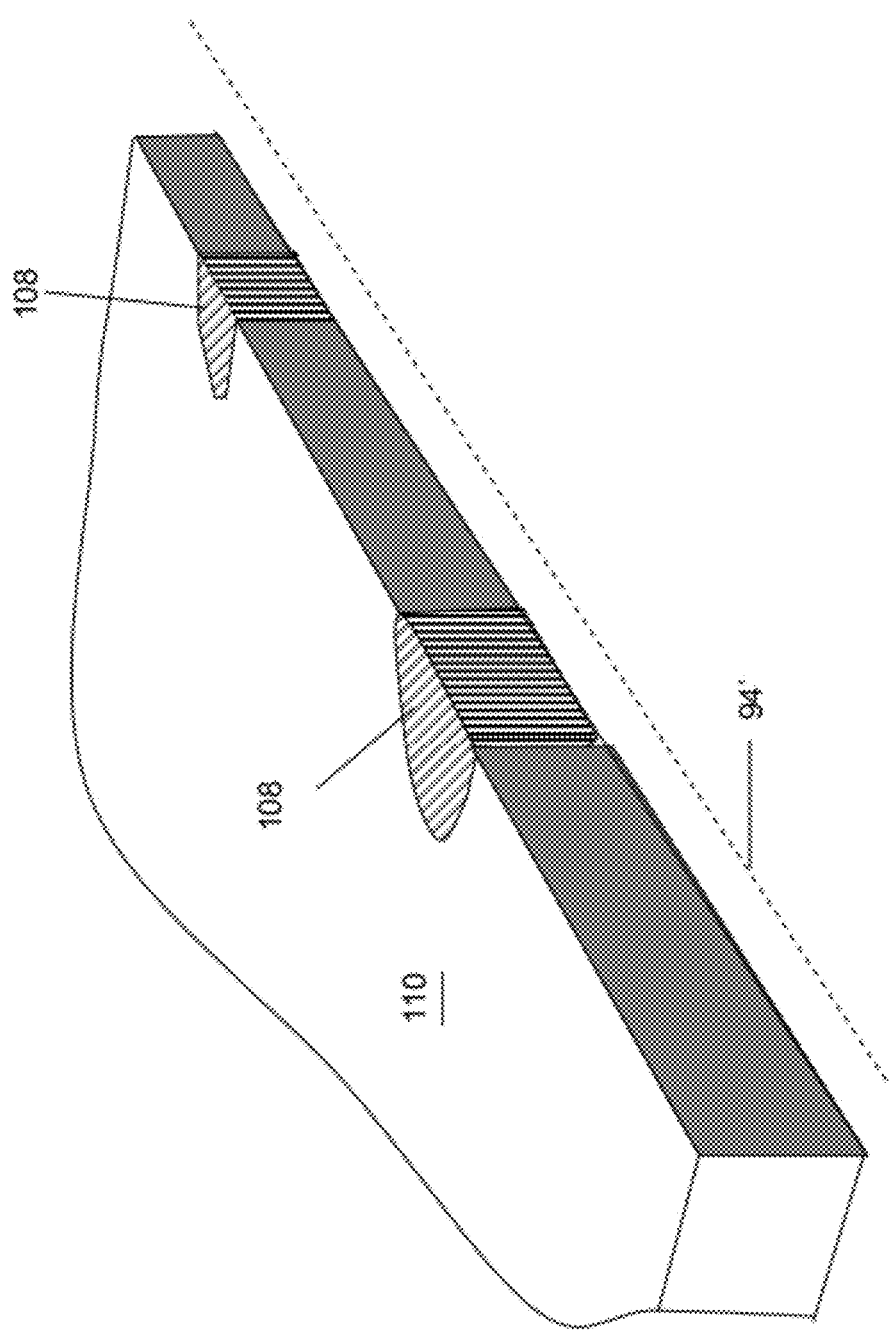

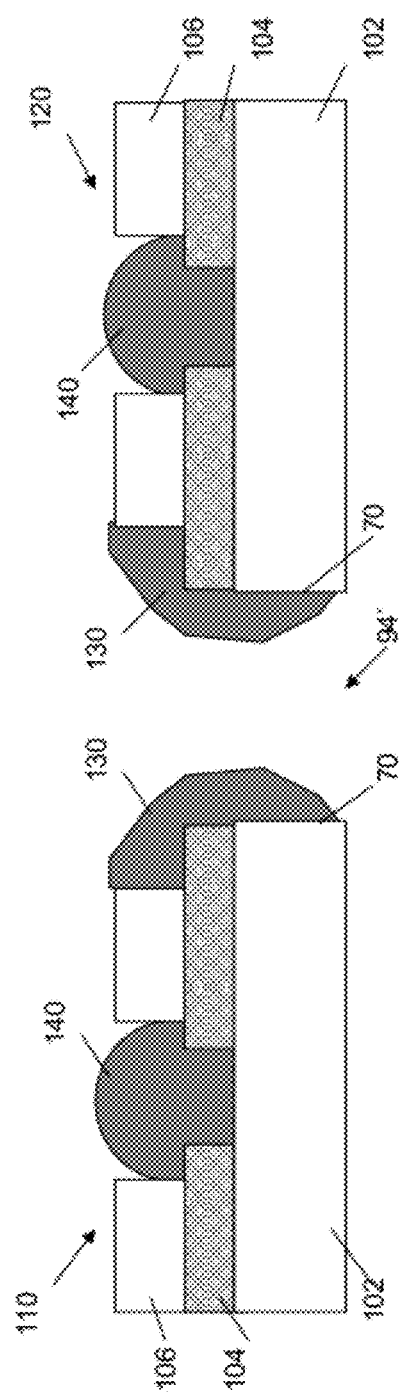
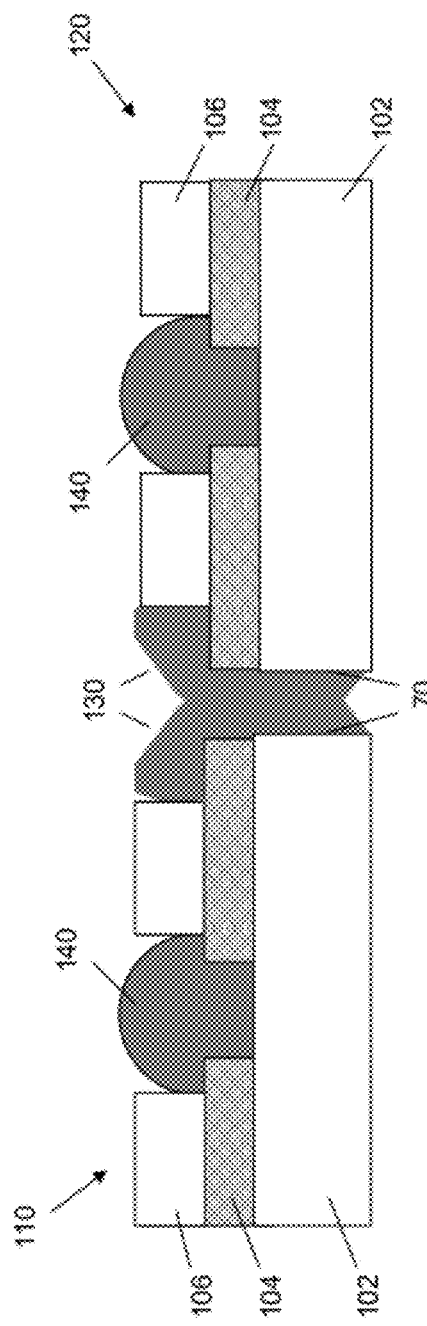
FIG. 4A
FIG. 4B

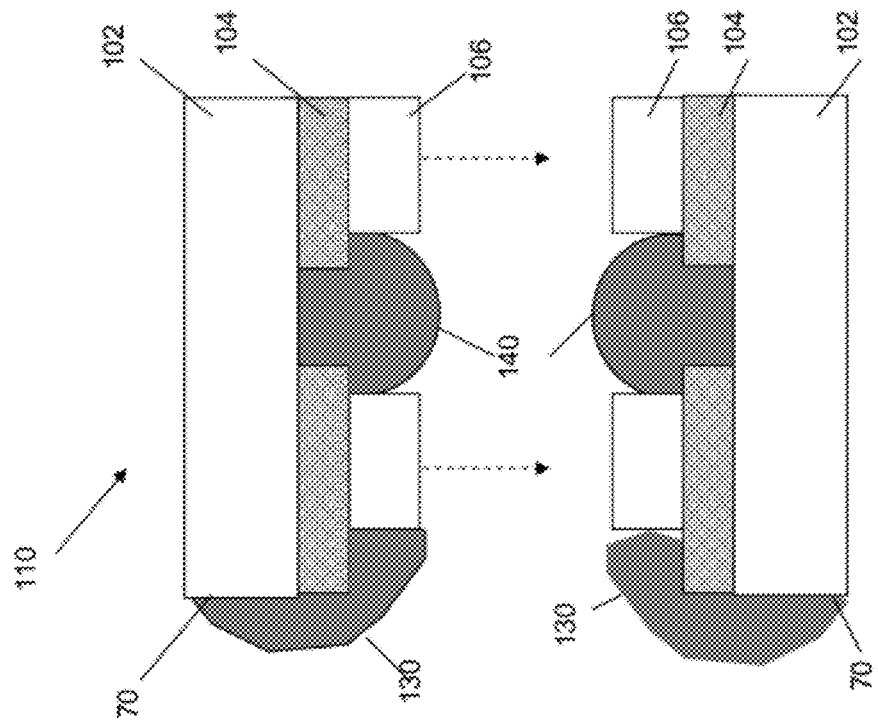
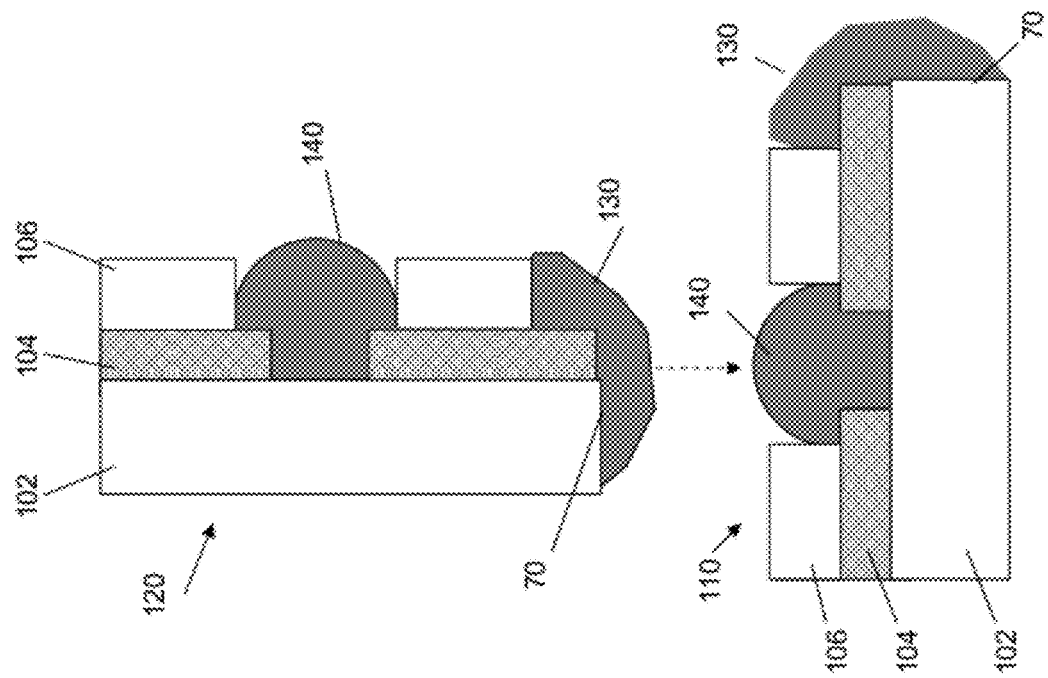
FIG. 4C
FIG. 4D

US 8,802,497 B2

FORMING SEMICONDUCTOR CHIP CONNECTIONS

CROSS-REFERENCE TO RELATED APPLICATIONS

This application is a divisional of U.S. patent application Ser. No. 12/471,656, filed on May 26, 2009, currently pending and hereby incorporated by reference in its entirety.

BACKGROUND

The subject matter disclosed herein relates to solutions for forming semiconductor chip connections.

BRIEF DESCRIPTION

Solutions for forming semiconductor chip connections are disclosed. In one embodiment, the semiconductor chip includes a body having a polyhedron shape with a pair of opposing sides; and a solder member extending along a side that extends between the pair of opposing sides of the polyhedron shape.

A first aspect of the disclosure provides a semiconductor chip comprising: a body having a polyhedron shape with a pair of opposing sides; and a solder member extending along a side that extends between the pair of opposing sides of the polyhedron shape.

A second aspect of the disclosure provides a method of forming a first semiconductor chip, the method comprising: depositing a plurality of dielectric layers over a chip body having a polyhedron shape with a pair of opposing sides; etching the plurality of dielectric layers to form a hole and etching the plurality of dielectric layers and the chip body to create a through silicon via (TSV) opening; dicing the chip body through the TSV opening, forming a plurality of semiconductor chips; depositing a solder layer in the hole, forming a solder ball element; depositing the solder layer in the TSV opening and in a space between the plurality of semiconductor chips; and cutting through a portion of the solder member and the solder layer in the space between the plurality of semiconductor chips, forming a solder member extending along a side that extends between the pair of opposing sides of the chip body.

A third aspect of the disclosure provides a semiconductor structure comprising: a plurality of semiconductor chips, each semiconductor chip including: a body having a polyhedron shape with a pair of opposing sides; and a solder member extending along a side that extends between the pair of opposing sides of the polyhedron shape; the plurality of semiconductor chips being connected at the solder member of each of the plurality of semiconductor chips.

A fourth aspect of the disclosure provides a method of forming a first semiconductor structure, the method comprising: connecting a plurality of semiconductor chips, each semiconductor chip including: a body having a polyhedron shape with a pair of opposing sides; a solder member extending between the opposing sides of the polyhedron shape; and a solder ball element located on a surface of one of the pair of opposing sides; the connecting including: heating the solder ball element of the first semiconductor chip and heating the solder ball element of the second semiconductor chip; and compressing the solder ball element of the first semiconductor chip against the solder ball element of the second semiconductor chip.

A fifth aspect of the disclosure provides a semiconductor structure comprising: a plurality of semiconductor chips, each semiconductor chip including: a body having a polyhedron shape with a pair of opposing sides; a first solder member extending between the opposing sides of the polyhedron shape; and a solder ball element located on a surface of one of the pair of opposing sides; the plurality of semiconductor chips being connected to each other by the solder ball element of each of the semiconductor chips; and a first connector chip including: a body having a polyhedron shape with a pair of opposing sides; a solder member extending between the opposing sides of the polyhedron shape; and a solder ball element located on a surface of one of the pair of opposing sides; the first connector chip being connected to each of the plurality of semiconductor chips.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which:

FIGS. 2-3B show cross-sectional views of semiconductor chips as they undergo the processing steps for forming semiconductor chip connections of embodiments of the invention.

FIG. 3C shows a perspective view of a portion of a semiconductor chip in one of the processing steps for forming semiconductor chip connections of an embodiment of the invention.

FIGS. 4A-6 show cross-sectional views of semiconductor chips as they undergo processing steps for forming semiconductor chip connections of embodiments of the invention.

FIG. 6 shows a top view of semiconductor chips connected via the chip connections of one embodiment of the invention.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

As used herein, the term "deposition" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Figure 1:
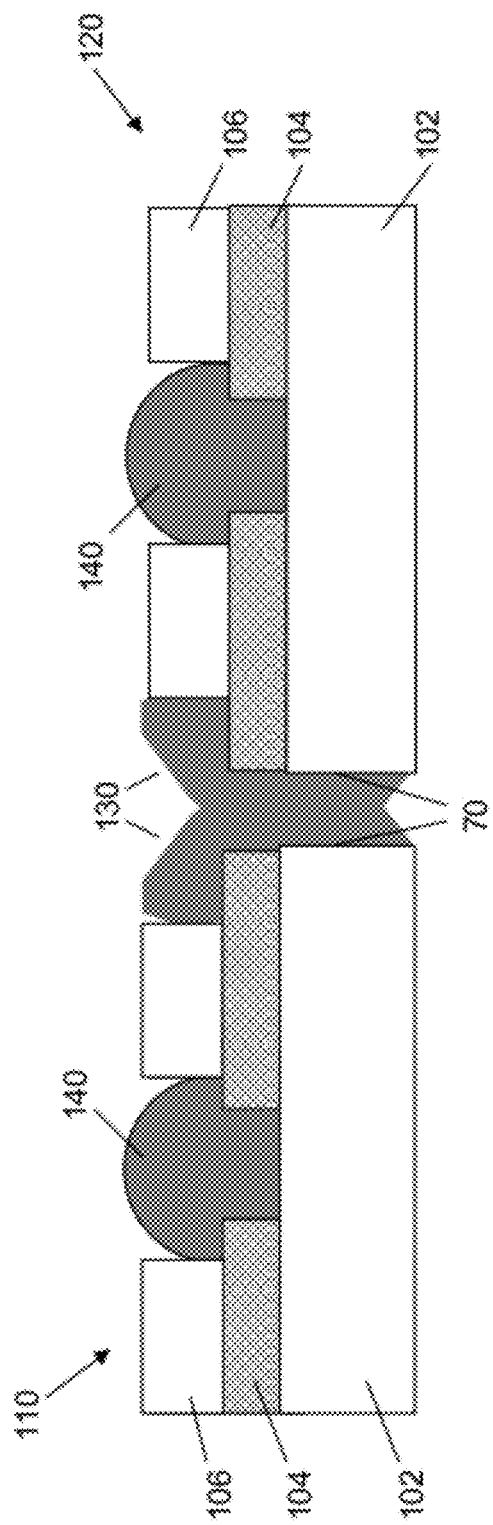
FIG. 1 shows a cross-sectional view of two semiconductor chips joined according to one embodiment of the invention.

Turning to the drawings, FIG. 1 shows two semiconductor chips 110, 120 joined according to one method of the invention. As described herein, the term "semiconductor chip" will be used to refer to the structures labeled 110 and 120 in FIGS.

1-6. Semiconductor chips 110, 120 may comprise a body having a polyhedron shape with a pair of opposing sides, and a solder member 130 extending along a side 70 that extends between the pair of opposing sides of the polyhedron shape. Further, solder member 130 may further extend over a corner formed by adjacent sides of the polyhedron shape. Semiconductor chips 110, 120 may also include holes 90, 92 existing in one of the pair of opposing sides of the polyhedron shape. Semiconductor chips 110, 120 may further comprise a solder ball element 140 located on a surface of one of the pair of opposing sides of the polyhedron shape. FIGS. 2-4B show steps in forming the semiconductor chips 110, 120 of FIG. 1. FIG. 4B is a duplicate of FIG. 1, and is shown as an illustrative final step in one method of forming semiconductor chips 110, 120 of the invention.

Figure 8:
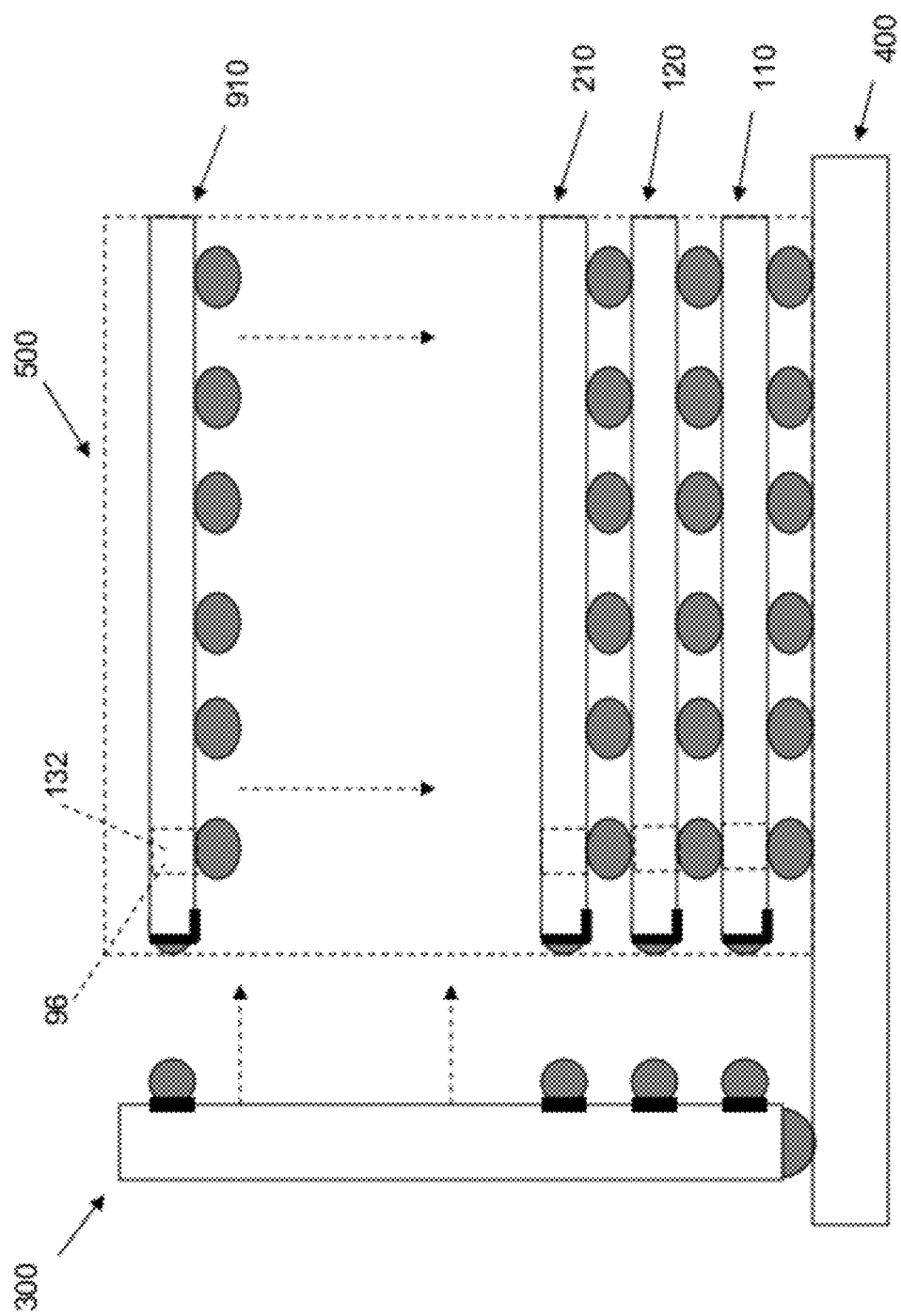
FIGS. 8-10 show cross-sectional views of a stack of semiconductor chips joined according to embodiments of the invention.
Figure 9:
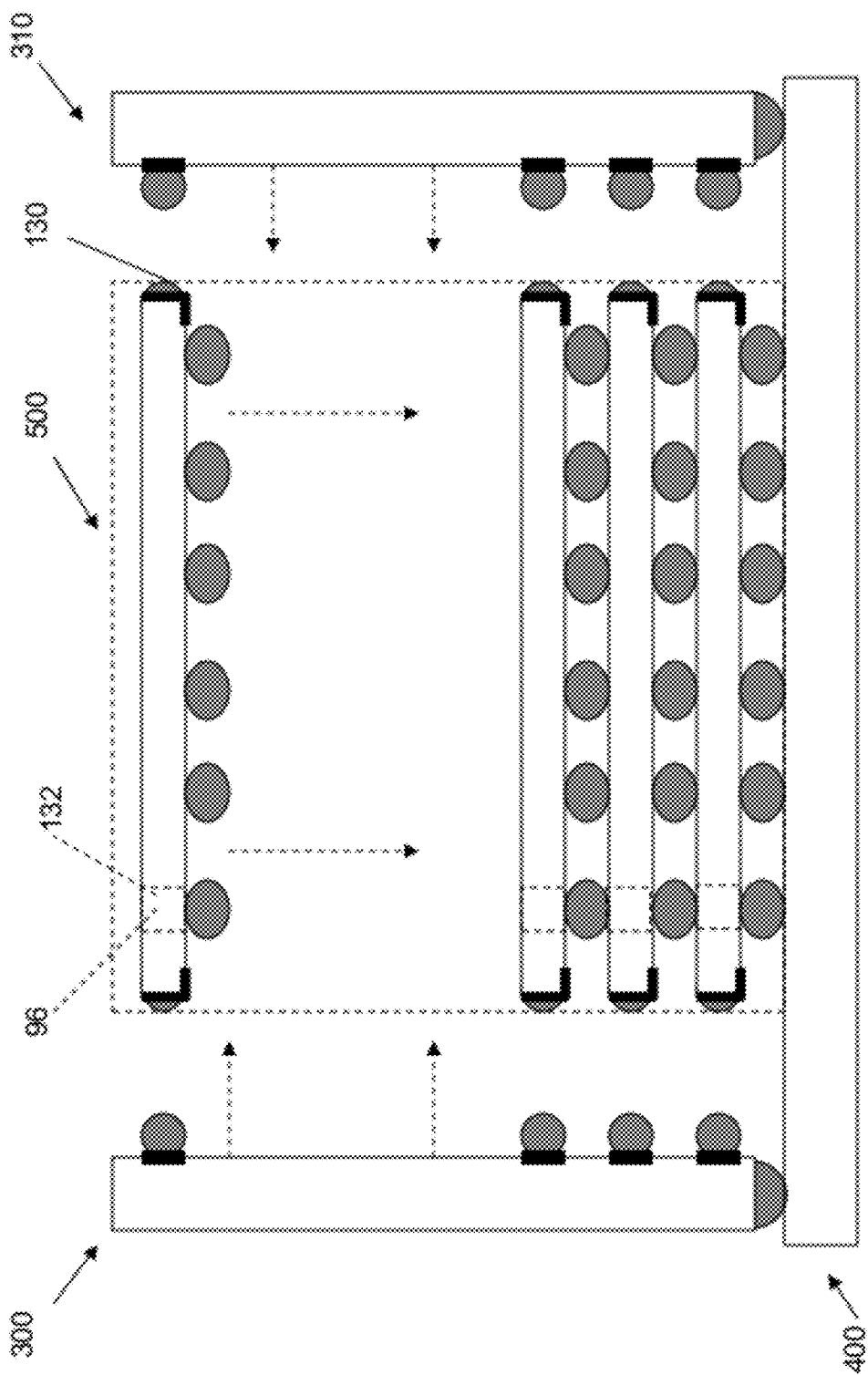
Figure 10:
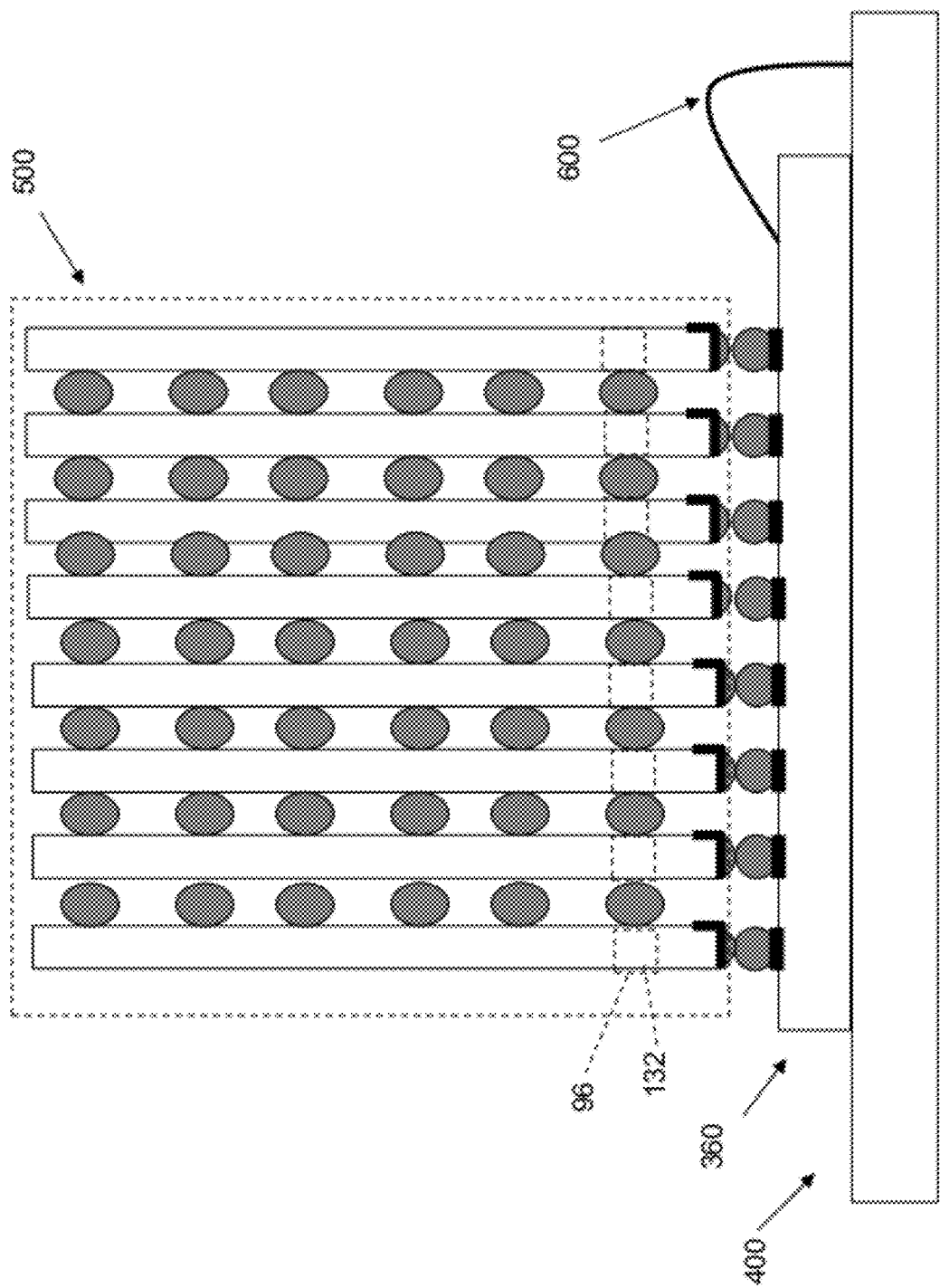

Referring to FIG. 2A, wafer 100 is shown containing two semiconductor chips 110, 120 separated by a through silicon via (TSV) opening 94. Each chip 110, 120 may include a chip body 102, and dielectric layers 104, 106 thereover. Chip body 102 may include circuitry typically used in semiconductor chips, for example, transistors and interconnects. As shown in FIG. 2A, chip body 102 and dielectric layers 104 and 106 of wafer 100 have undergone an etching process, creating holes 90, 92 and TSV opening 94. Additionally, shown in phantom, is a second TSV opening 96 located within semiconductor chip 110. TSV opening 96 is shown in FIGS. 2A-3B and FIGS. 7-10 in phantom. It is understood that TSV opening 96 may be formed along with holes 90, 92, and may be filled with solder layer 108 in a similar manner as holes 90, 92 (FIG. 2B). A plurality of TSV openings 96 may be formed within an interior portion of semiconductor chip 110. Further, TSV openings 96 may be formed within an interior portion of a plurality of semiconductor chips 110, 120, 210, 910 (FIGS. 8-10). TSV openings 94, 96 may be formed in any conventional manner, for example, using a laser drilling process. Wafer 100 may be formed of silicon and contain other semiconductor chips (not shown). After deposition of dielectric layers 104, 106 over chip body 102, semiconductor chips 110, 120 may be separated (diced) as shown in FIG. 3B using, for example, a diamond-coated blade. While FIGS. 1-3B and 4-5 show each semiconductor chip 110 and 120 (before and after dicing) including a chip body 102 and two dielectric layers 104 and 106 thereover, this arrangement is merely illustrative. Any number of dielectric layers may be located over the chip body, as may other layers included in semiconductor chips now known or later developed.

Referring to FIG. 2B, wafer 100 is shown further including a solder layer 108 which is deposited. Solder layer 108 may be deposited and planarized to remove excess solder material from wafer 100. Solder layer 108 may be formed, for example, of copper, silver, tin, lead or gold. However, solder layer 108 may be formed using other wetable metal alloys as well.

Referring to FIGS. 3A-3B, methods in etching and dicing of wafer 100 are disclosed. In FIG. 3A, wafer 100 is shown further including a sacrificial layer 114 and a mask layer 116 located over solder layer 108 and dielectric layer 106. As in FIG. 2B, TSV opening 94 is shown filled with solder layer 108. TSV opening 94 may be formed on an edge of semiconductor chips 110, 120, as well as within an interior portion of semiconductor chips 110, 120 (TSV opening 96 shown in phantom). TSV opening 94 formed on an edge of semiconductor chips 110, 120 may be larger than TSV opening 96 formed in an interior portion of semiconductor chips 110, 120. Sacrificial layer 114 and mask layer 116 may be deposited over wafer 100 using conventional deposition techniques, for example, chemical or physical deposition. FIG. 3B shows semiconductor chips 110, 120 after etching and/or dicing has occurred. As shown, semiconductor chips 110, 120 have been separated (diced) and opening 94' has been created. Etching or dicing of semiconductor chips 110, 120 from wafer 100 may be performed in a variety of ways, and methods may vary with thickness of wafer 100. For example, where a wafer 100 has a thickness ranging from 30 um to 100 um, etching may be performed. In this case, sacrificial layer 114 may be any dielectric material, for example, nitride, oxide, or TEOS. Further, mask layer 116 may be patterned using photolithographic exposure. Where wafer 100 is above 100 um in thickness, conventional saw cutting may be used to dice semiconductor chips 110, 120. In this case, only sacrificial layer 114 may be required to protect the surface of semiconductor chips 110, 120 from the saw blade. Where saw cutting is used, the cut may be made through the center of TSV opening 94 (FIG. 3A) to provide each resulting semiconductor chip 110, 120 with enough remaining solder layer 108 to form solder member 130 (as shown in FIG. 4A).

Referring to FIG. 3C, a perspective view of one step in a method of etching and dicing of wafer 100 is shown. Semiconductor chip 110 is shown, after dicing, and with layer details (i.e., sacrificial layer 114, etc.) and hole 90 omitted. Further, an additional TSV opening 94 has been created and filled with solder layer 108. It should be noted that during processing, a plurality of TSV openings 94 may be formed in semiconductor chip 110, and that one or more TSV openings 94 may be filled with solder layer 108. Further, solder layer 108 may be processed to form one or more solder members 130 within one or more TSV openings 94 (FIG. 4A). FIG. 3C shows a perspective view from the point of view of opening 94' of FIG. 3B. In this embodiment, TSV openings 94 have been filled with solder layer 108, and chips 110, 120 have been diced (chip 120 not shown). As will be described in further detail with respect to the following figures, solder layer 108 may later be melted to form solder member 130.

Referring to FIG. 4A, semiconductor chips 110, 120 are shown with sacrificial layer 114 and mask layer 116 removed. Solder layer 108 (FIG. 3B) has been reflowed to create solder member 130 and solder ball element 140. In this process, heat may be applied to the solder layer 108 in order to allow for shaping. Heat may be applied, for example, using ultrasound. Once solder layer 108 is heated, surface tension keeps solder layer 108 attracted to side 70, while shaping takes place. While solder member 130 and solder ball element 140 are shown as containing curved surfaces, it is understood that solder member 130 and solder ball element 140 can take on many different shapes due to different etching methods.

Turning to FIG. 4B, semiconductor chips 110, 120 are shown joined by solder members 130 of each semiconductor chip. Semiconductor chips 110, 120 may be joined, for example, through re-melting of solder members 130. Targeted melting using ultrasound is one method in which semiconductor chips 110, 120 may be joined. In this case, sides 70 of semiconductor chips 110, 120 may be aligned such that solder members 130 of each semiconductor chip 110 and 120 are substantially touching. Semiconductor chips 110 and 120 may be forced together mechanically, while solder members 130 of each chip are heated to a melting temperature. Melting temperatures for solder members 130 may be in the range of 280 degrees Celsius to 350 degrees Celsius. Once heated, solder members 130 may become one, and upon cooling, may join semiconductor chips 110 and 120 together. While semiconductor chips 110,120 are shown joined at an approximately 180 degree angle by solder members 130, it is understood that semiconductor chips 110, 120 may be joined, for example, at acute or obtuse angles.

FIGS. 4C-4D show two alternative embodiments in which semiconductor chips 110 and 120, are joined in different arrangements. In one embodiment, FIG. 4C shows semiconductor chips 110, 120 may be joined by the solder member 130 of semiconductor chip 120 and solder ball element 140 of semiconductor chip 110 (joining shown in phantom). In another alternative embodiment, FIG. 4D shows semiconductor chips 110, 120 may be joined using solder ball elements 140 of each semiconductor chip 110, 120 (joining shown in phantom). Semiconductor chips 110, 120 may be joined in a similar manner as described above, using for example, re-melting of solder members 130 and solder ball elements 140. While FIGS. 1-4B show semiconductor chip connections between two semiconductor chips 110, 120, it is understood that connections may be made between a greater number of semiconductor chips in a variety of arrangements.

Figure 5:
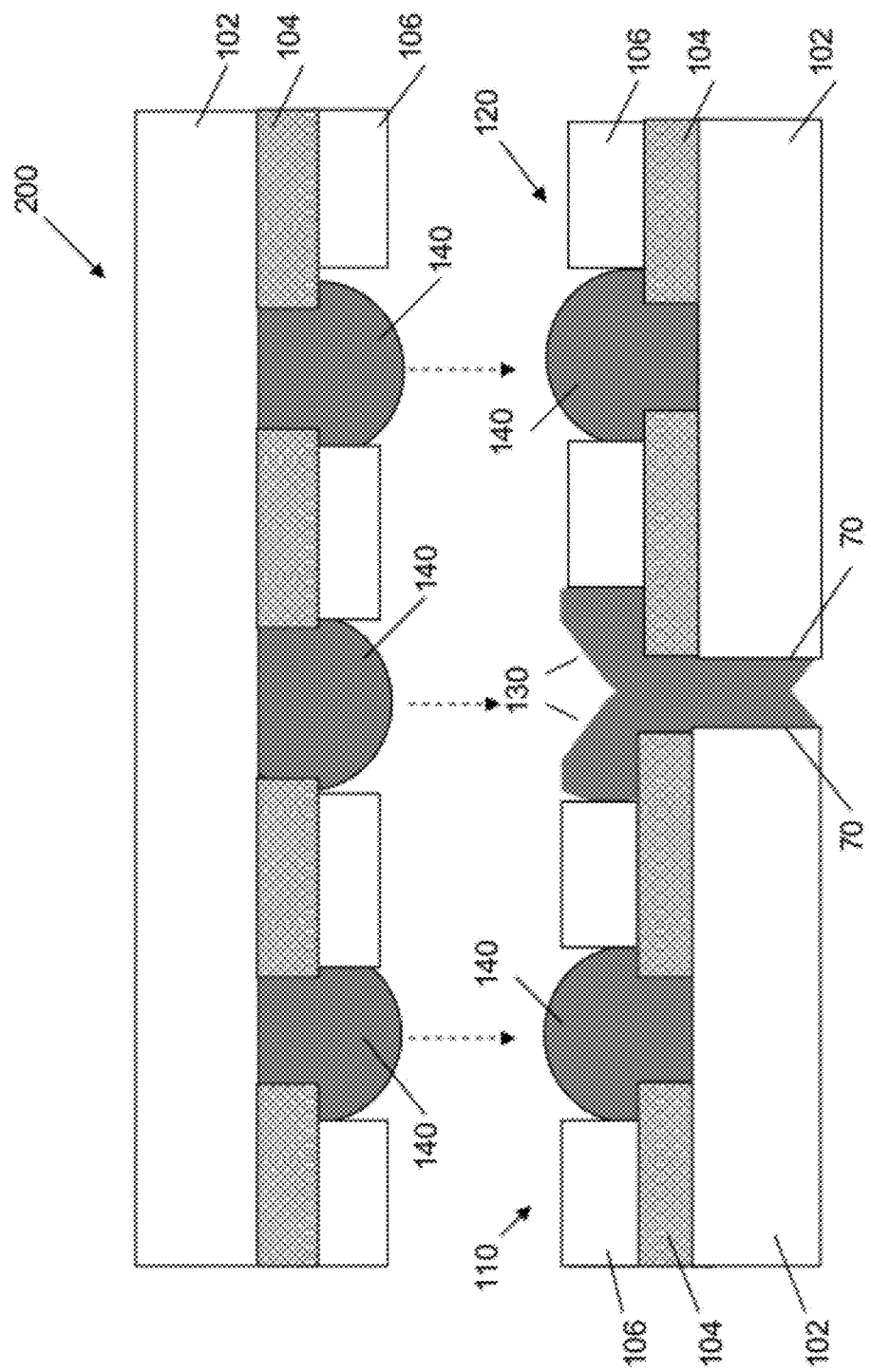

Referring to FIG. 5, another embodiment of joined semiconductor chips 110, 120 is shown. In this embodiment, a third semiconductor chip 200 is joined to semiconductor chips 110, 120. Third semiconductor chip 200 may include a chip body 102, dielectric layers 104, 106, and solder ball elements 140. Third semiconductor chip 200 may be formed in a manner similar to that disclosed in the descriptions of FIGS. 1-4B. FIG. 5 shows third semiconductor chip 200 in a flipped orientation. As used herein, the term flipped describes an orientation which is different from the orientation in which the chip was formed. In this case, third semiconductor chip 200 has been flipped such that it may be joined with semiconductor chips 110, 120 via solder ball elements 140 of third semiconductor chip 200 and solder ball elements 140 and solder members 130 of semiconductor chips 110, 120 (joining shown in phantom). Joining of third semiconductor chip 200 and semiconductor chips 110, 120 may be performed similarly to joining of semiconductor chips 110 and 120. While FIG. 5 shows third semiconductor chip 200 including a chip body 102 and two dielectric layers 104 and 106 thereover, this arrangement is merely illustrative. Any number of dielectric layers may be located over the chip body, as may other layers included in semiconductor chips now known or later developed.

Figure 6:
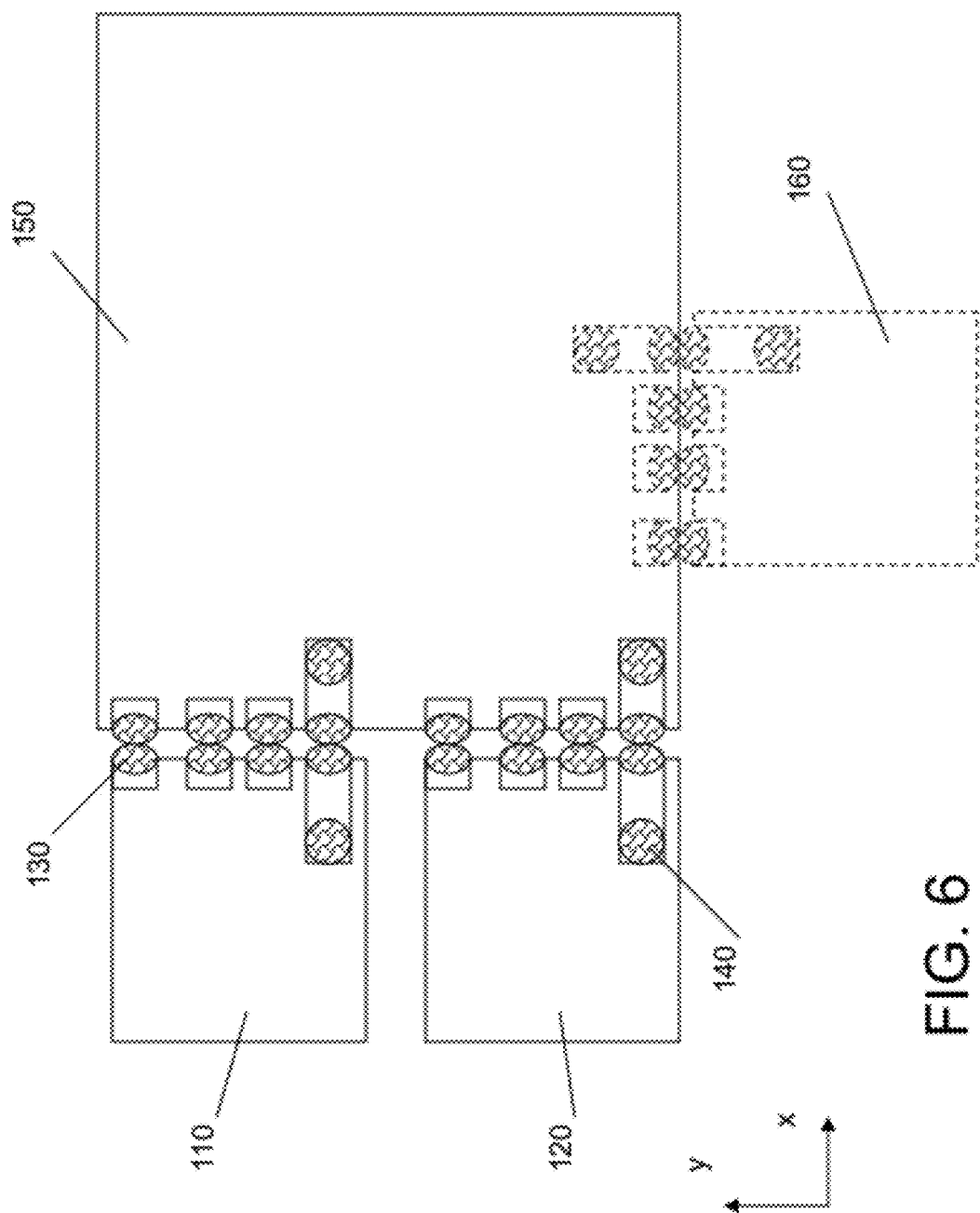

Referring to FIG. 6, another embodiment of the disclosure is illustrated. In this embodiment, a plurality of semiconductor chips is shown, joined via solder members 130. As shown, semiconductor chips 110, 120, 150, 160 may include multiple solder members 130 and a solder ball element 140. However, semiconductor chips 110, 120, 150, 160 may include fewer or greater numbers of solder members 130 and solder ball elements 140 than those shown. As shown in FIG. 6, semiconductor chips 110 and 120 are connected to base chip 150 in the x direction via solder members 130 of each chip. Further, semiconductor chips 110 and 120, along with base chip 150 may each contain solder ball element 140 for joining flipped chips (not shown) in the z direction (out of page). Even further, a greater or lesser number of semiconductor chips may be joined to base chip 150 using solder members 130. Shown in phantom is semiconductor chip 160, which contains similar elements to semiconductor chips 110 and 120. Semiconductor chip 160 may be connected to base chip 150 in the y direction using solder members 130. Semiconductor chip 160 may also be connected to other semiconductor chips, for example, semiconductor chip 120 via solder members 130 (connection not shown).

Figure 7:
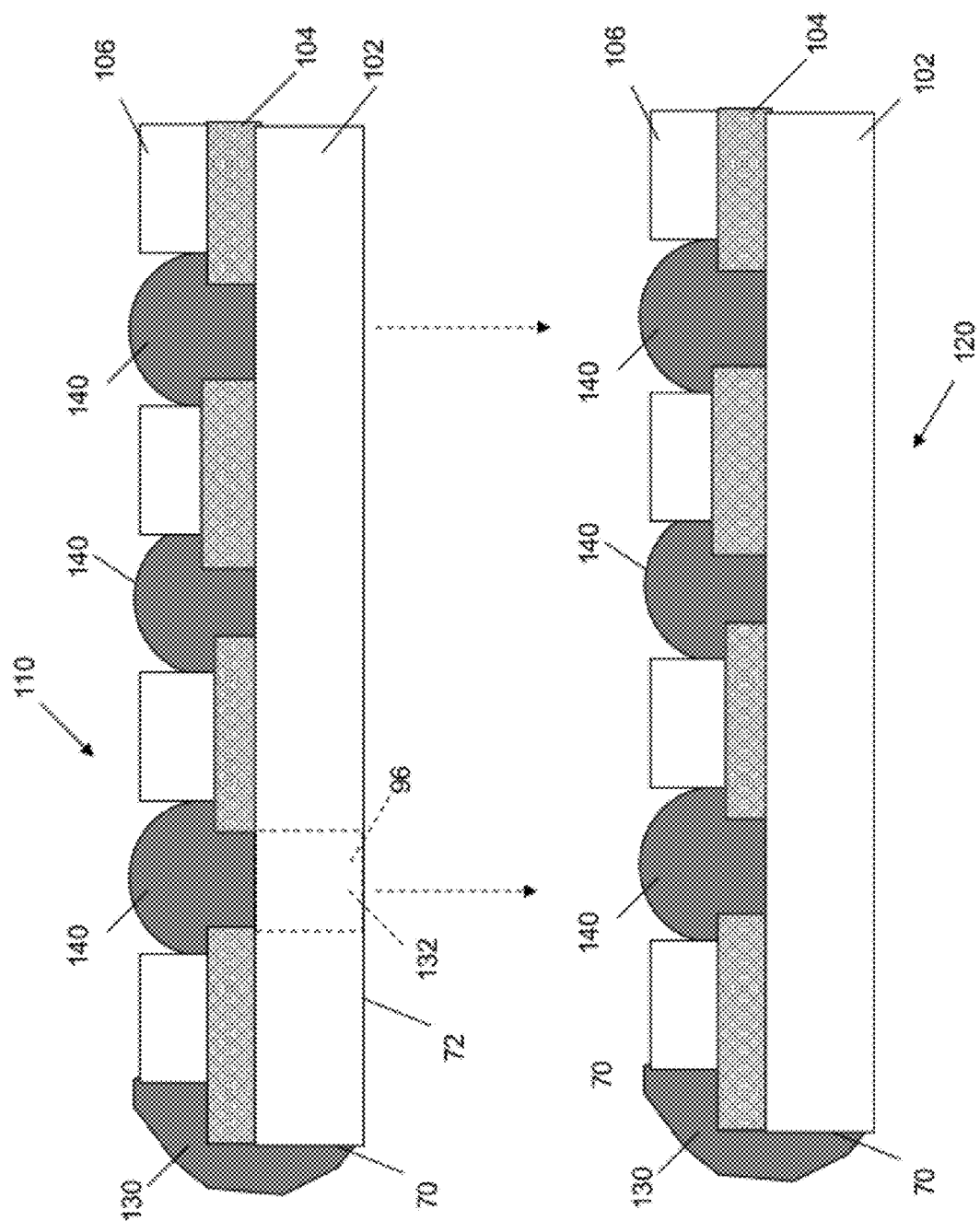
FIG. 7 shows a cross-sectional view of semiconductor chips as they undergo processing steps for forming semiconductor chip connections of embodiments of the invention.

Referring to FIG. 7, semiconductor chips 110, 120 are shown containing additional solder ball elements 140. Semiconductor chips 110, 120 may contain a plurality of solder ball elements 140, as additional solder ball elements 140 may provide electrical connectivity and mechanical support for a semiconductor chip stack structure (FIG. 1). Semiconductor chips 110, 120 may be joined by solder ball element 140 of semiconductor chip 120 and the side 72 of semiconductor chip 110. Semiconductor chips 110, 120 may be joined, using for example, re-melting of solder ball elements 140 via ultrasound. However, semiconductor chips 110, 120 may be joined via any flip-chip bonding technique allowing for solder ball element 140 to bond with side 72 of semiconductor chip 110.

Referring to FIG. 8, one embodiment of a semiconductor chip stack structure is shown. Semiconductor chips 110, 120 have been flipped (rotated 180 degrees) from the configuration of FIG. 7. Joining of semiconductor chips 110, 120 may be performed before or after flipping, and may be performed before or after joining of other elements of semiconductor chip stack structure. As shown in FIG. 8, semiconductor chips 110, 120 may be joined by solder ball element 140 of semiconductor chip 120 and side 72 of semiconductor chip 110 (reference numerals omitted). Further, additional semiconductor chips 210, 910 may be joined to semiconductor chips 110, 120. Semiconductor chip 210 may be joined to semiconductor chip 120 in a similar fashion to joining of semiconductor chips 110 and 120. Semiconductor chip 910 may be joined to semiconductor chip 210 in a similar fashion to joining of semiconductor chips 110 and 120. Additionally, a plurality of semiconductor chips may be joined in the stack 500 (shown in phantom) in a similar fashion to joining of semiconductor chips 110 and 120. Accordingly, stack 500 may include a plurality of semiconductor chips capable of forming part of the semiconductor chip stack structure. Further, FIG. 8 shows connector chip 300 joined to stack 500 including a plurality of semiconductor chips (joining shown in phantom). Joining of connector chip 300 and semiconductor chips 110, 210, 910 may be performed in a similar fashion to joining of connector chip 300 and semiconductor chip 120 (FIG. 4C). Connector chip 300 may be joined to each semiconductor chip 110, 120, 210, 910 simultaneously, or at different times. Connector chip 300 and semiconductor chip 110 may further be connected to substrate 400, either simultaneously or at a different time. Connector chip 300 and semiconductor chip 110 may be joined to substrate 400 using conventional flip chip (C4) methods or other methods described herein. Substrate 400 may, for example, be formed of silicon.

Referring to FIG. 9, an alternate embodiment of a semiconductor chip stack structure is shown. In this embodiment, stack 500 is shown including a plurality of semiconductor chips as described in reference to FIG. 8. Stack 500 may be connected to connector chip 300. Additionally, stack 500 may be connected to a second connector chip 310 in a similar fashion as described with reference to FIG. 8. Second connector chip 310 may be formed in a similar fashion as connector chip 300. Further, second connector chip 310 may be connected to stack 500 via additional solder members 130 of semiconductor chips 110, 120, 210, 910 and solder ball elements 140 of second connector chip (reference numerals omitted). Additional solder members 130 of semiconductor chips 110, 120, 210, 910 may be formed in a manner described with reference to FIGS. 1-4. In this embodiment, semiconductor chips 110, 120, 210, 910 may be diced in multiple directions allowing for formation of solder members 130 on more than one side 70 of semiconductor chips 110, 120, 210, 910. Additional solder members 130 allow stack 500 to be connected to second connector chip 310. Second connector chip 310 allows for further mechanical stability as well as electrical connectivity between elements of the semiconductor chip stack structure.

FIG. 10 shows another alternate embodiment of a semiconductor chip stack structure. In this embodiment, stack 500 is shown with semiconductor chips aligned perpendicular to substrate 400. In one embodiment, stack 500 may connect to a base chip 360. Stack 500 and base chip 360 may be connected through techniques described herein. Base chip 360 may contain solder ball elements 140 such as those described with reference to semiconductor chips 110, 120. However, base chip 360 and stack 500 may be connected through re-melting of solder members 130 of the semiconductor chips of stack 500. Base chip 360 may be mounted on substrate 400, which may have electrical connections with other portions of an electronic device (not shown). Base chip 360 may be mounted to substrate 400 in any conventional manner. Further, base chip 360 may form an electrical connection with substrate 400 through wire 600. Base chip 360 and substrate 400 may be wire-bonded using conventional wire-bonding techniques. Wire 600 may be connected with base chip 360 and substrate 400 in any conventional manner.

The methods and structure as described above are used in the fabrication of semiconductor chips. The resulting semiconductor chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The foregoing drawings show some of the processing associated according to several embodiments of this disclosure. In this regard, each drawing or block within a flow diagram of the drawings represents a process associated with embodiments of the method described. It should also be noted that in some alternative implementations, the acts noted in the drawings or blocks may occur out of the order noted in the figure or, for example, may in fact be executed substantially concurrently or in the reverse order, depending upon the act involved. Also, one of ordinary skill in the art will recognize that additional blocks that describe the processing may be added.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A method of forming a semiconductor structure, the method comprising:
  forming a plurality of semiconductor chips by:
    depositing a plurality of dielectric layers over a chip body having a polyhedron shape with a pair of opposing sides;
    etching the plurality of dielectric layers to form a hole, and etching the plurality of dielectric layers and the chip body to create a through silicon via (TSV) opening;
    dicing the chip body through the TSV opening, forming the plurality of semiconductor chips and a space between the plurality of semiconductor chips;
    depositing a solder layer in the hole, forming a solder ball element;
    depositing the solder layer in the TSV opening and in the space between the plurality of semiconductor chips after the dicing of the chip body through the TSV opening,
    the depositing of the solder layer in the TSV opening including filling the TSV opening with the solder layer to form a filled TSV; and
    cutting through a portion of the solder layer in the filled TSV and the solder layer in the space between the plurality of semiconductor chips, forming a solder member extending completely along a side that extends between the pair of opposing sides of the chip body;
  connecting the plurality of semiconductor chips, each semiconductor chip including:
    a body having a polyhedron shape with a pair of opposing sides;
    a solder member extending completely along a side that extends between the opposing sides of the polyhedron shape; and
    a solder ball element located on a surface of one of the pair of opposing sides;
  the connecting including:
    heating the solder ball element of a first semiconductor chip and heating the solder ball element of a second semiconductor chip; and
    compressing the solder ball element of the first semiconductor chip against the solder ball element of the second semiconductor chip;
  connecting a connector chip to one of the plurality of semiconductor chips, the connector chip including:
    a body having a polyhedron shape with a pair of opposing substantially planar sides;
    a solder member extending completely along a side that extends between the opposing substantially planar sides of the polyhedron shape; and
    a solder ball element located on a surface of one of the pair of opposing substantially planar sides,
  the connecting of the connector chip to one of the plurality of semiconductor chips including:
    heating the solder ball element of the connector chip and heating the solder member extending completely along the side that extends between the opposing substantially planar sides of the polyhedron shape of one of the plurality of semiconductor chips; and compressing the solder ball element of the connector chip against the solder member of one of the plurality of semiconductor chips, wherein the connector chip forms a substantially right angle with the one of the plurality of semiconductor chips;

connecting the connector chip and the one of the plurality of semiconductor chips to a substrate, wherein the connector chip is connected to the substrate by the solder member of the connector chip that extends completely along the side that extends between the opposing substantially planar sides of the polyhedron shape, and wherein the one of the plurality of semiconductor chips is connected to the substrate by the solder ball element of the semiconductor chip.

2. The method of claim 1, wherein the solder member in each of the plurality of semiconductor chips further extends over a corner formed by adjacent sides of the body of each semiconductor chip.

\* \* \* \* \*